(12) United States Patent
Koch

(10) Patent No.: US 11,360,645 B2
(45) Date of Patent: Jun. 14, 2022

(54) METHOD AND DEVICE FOR DISPLAYING MEASUREMENT RESULTS IN TAB WINDOWS

(71) Applicant: Rohde & Schwarz GmbH & Co. KG, Munich (DE)

(72) Inventor: Thomas Koch, Chemnitz (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 90 days.

(21) Appl. No.: 16/699,202

(22) Filed: Nov. 29, 2019

(65) Prior Publication Data
US 2021/0165541 A1 Jun. 3, 2021

(51) Int. Cl.
G06F 3/0483 (2013.01)
G01R 13/02 (2006.01)
G06F 3/14 (2006.01)

(52) U.S. Cl.
CPC ......... *G06F 3/0483* (2013.01); *G01R 13/029* (2013.01); *G06F 3/1423* (2013.01)

(58) Field of Classification Search
None
See application file for complete search history.

(56) References Cited

U.S. PATENT DOCUMENTS

| 6,272,172 B1 | 8/2001 | Deshpande et al. |
| 7,928,981 B2 | 4/2011 | Sugiyama et al. |
| 2008/0209338 A1* | 8/2008 | Li .......... G06F 16/957 715/745 |
| 2013/0267792 A1* | 10/2013 | Petersen ....... G16H 50/70 600/301 |
| 2014/0040819 A1* | 2/2014 | Duffy ....... G06F 9/451 715/789 |
| 2019/0391712 A1* | 12/2019 | Singh ........ G06F 3/0483 |
| 2020/0319763 A1* | 10/2020 | Kim ........ G06F 3/0483 |
| 2020/0333376 A1* | 10/2020 | Graf ........ G01R 19/0092 |
| 2021/0133240 A1* | 5/2021 | Talbot ....... G06F 3/0483 |

FOREIGN PATENT DOCUMENTS

EP 3379268 A1 9/2018

OTHER PUBLICATIONS

R&S®FSW Signal and Spectium Analyzer User Manual, Rohde & Schwarz GmbH & Co. KG, User Manual 1173.9411.02—43, 2019, 1,450 Pages.

* cited by examiner

*Primary Examiner* — Peter Hoang
(74) *Attorney, Agent, or Firm* — Ditthavong, Steiner & Mlotkowski

(57) ABSTRACT

A method for displaying measurement results comprises the steps of: displaying a first measurement result in a first tab window; creating a second tab window; changing at least one measurement device setting to display a second measurement result in the second tab window; and storing the second tab window.

13 Claims, 7 Drawing Sheets

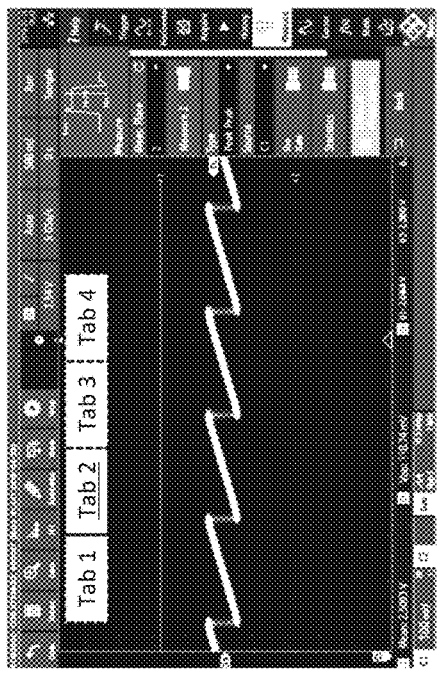
Fig. 7A
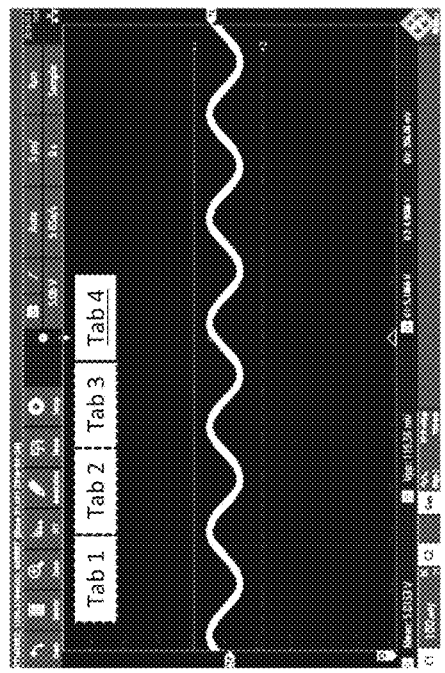
Fig. 7B
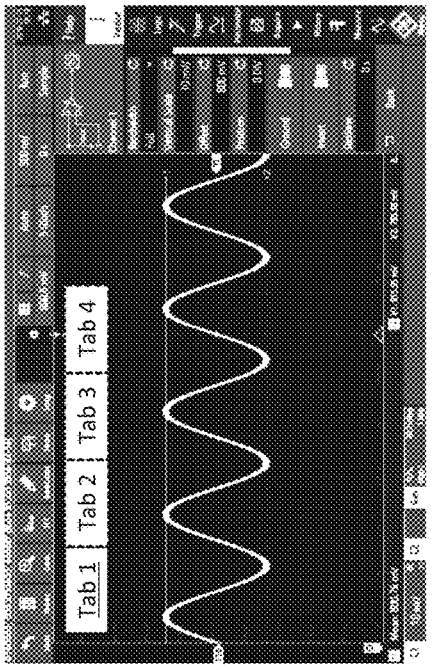
Fig. 7C
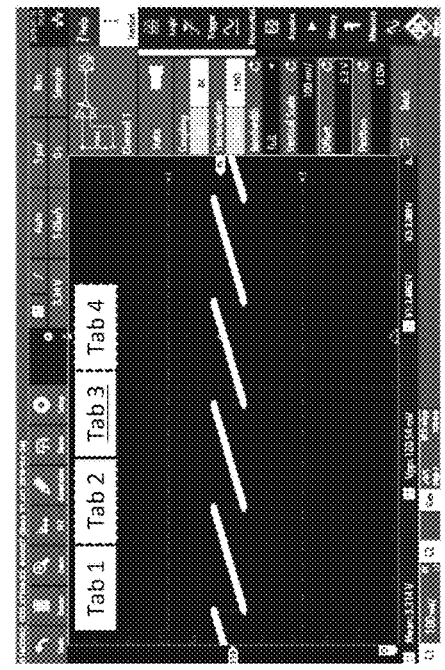
Fig. 7D
Fig. 7

METHOD AND DEVICE FOR DISPLAYING MEASUREMENT RESULTS IN TAB WINDOWS

The present invention relates to the field of measurement devices, such as digital memory oscilloscopes or spectrum analyzers, and in particular to performing complex measurement tasks with such a measurement device. The present invention further relates to an improved user interface for a measurement device and therefore provides a method and device for displaying a first measurement result in a first tab window and displaying a second measurement result in a second tab window, wherein at least one measurement device setting is changed for displaying the second measurement result in the second tab window.

Performing signal analysis with a measurement device (such as a digital memory oscilloscope or a spectrum analyzer) usually involves probing several measurement points of an electronic device, e.g. by means of probes connected to several input channels of the measurement device. The information, which is obtained during the signal analysis typically is presented on a single screen of the measurement device. Due to the number and complexity of the analyzed input signals, the screen of the measurement device often is crowded and the information, which is presented, is confusing. Moreover, when a user wants to navigate through a history of measurement device settings (e.g. scale, offset, zoom or bandwidth), which are made during measurement, this can only be done in a sequential manner by using do- and undo-buttons of the measurement device, or by using a save-recall function.

That is, there is the lack of a method to display complex measurement information in a clear manner, and to allow for efficient mapping of a measurement task to a user interface of the measurement device.

Therefore, the object of the invention is to improve displaying measurement results on a measurement device. Moreover, the object is to provide an according device, computer program product and computer-readable storage medium.

The object is solved by the features of the first independent claim for the system and by the features of the second independent claim for the method. Further, it is solved by the features of an associated computer program product and by a computer-readable storage medium. The dependent claims contain further developments.

An inventive method for displaying measurement results comprises the steps of: displaying a first measurement result in a first tab window; creating a second tab window; changing at least one measurement device setting to display a second measurement result in the second tab window; and storing the second tab window.

This is beneficial, as the measurement results can be presented in a clear and well-arranged manner. The tab windows enable the user to make adaptions to the manner of presenting the measurement results according to his needs. Moreover, storing the second tab window allows for creating a workflow for a complex measurement process and for displaying measurement results of such a process. The workflow can be saved and loaded by a user later. Each tab which is part of the workflow may correspond to a measurement step which is to be carried out by the user when performing the measurement process (e.g. on an electronic component). This also enables faster application- or measurement task-oriented operation, clearer setting of adjustments and better displaying via a clear tree structure. The composition, the structure, or the development of a measuring task can be better understood through several tab windows. The tab windows correspond to sub-steps of the measurement task and contribute to a better structuring of the task.

In particular, a measurement device setting comprises setting at least one of scale, offset, zoom, bandwidth, translation, sample rate, position, inversion, fast Fourier transformation (FFT), or time-base of a measurement result.

In particular, the first measurement result is obtained by measuring a first signal. In particular, the second measurement result is obtained by measuring a second signal. Alternatively, the second measurement result can also be obtained based on the first measurement result, as it is going to be described below.

In particular, a tab window is a graphical control element that allows multiple views or panels to be contained within a single window or screen.

In particular, a measurement device such as an oscilloscope (e.g. a digital memory oscilloscope), a logic analyzer, a spectrum analyzer, a multimeter, or the like can carry out the method.

In particular, a measurement result represents a signal (such as voltage or current) over time.

Advantageously and preferably, the method further comprises the step of displaying the first tab window and the second tab window in a stacked manner.

In particular, displaying the first tab window and the second tab window in a stacked manner means that only the first tab window or the second tab window is visible at a time, depending on which windows is selected.

This allows organizing a screen of a measurement device in a stacked manner, that is, to assign different content to different tab windows and to be able to only show one tab window at a time.

Advantageously and preferably, the method further comprises the step of displaying the first tab window at a first monitor and displaying the second tab window at a second monitor.

In particular, displaying the first tab window at a first monitor and displaying the second tab window at a second monitor means that multiple monitors can be used to provide a different displaying means to each tab window.

This allows for increasing the overall area available for displaying tab windows.

Advantageously and preferably, the method further comprises the step of obtaining the second measurement result based on the first measurement result, and/or deriving the second measurement result from the first measurement result.

In particular, obtaining the second measurement result based on the first measurement result, and/or deriving the second measurement result from the first measurement result includes that the first measurement result relates to a first part of a measured signal, and that the second measurement result relates to a second part of the measured signal. The first measurement result may e.g. be the rising clock edge of a signal and the second measurement result can e.g. be the falling clock edge of the signal.

This allows for displaying and analyzing several parts of a same measurement result (e.g. a same signal) in more detail.

Advantageously and preferably, the method further comprises the step of storing a vector describing a dependency between the first measurement result and the second measurement result.

This provides an efficient manner of storing information, which defines a relation between the first measurement result and the second measurement result.

In particular, the vector further describes a dependency between the first tab windows and the second tab window.

If e.g. the second measurement result is obtained, based on (or derived from) the first measurement result, the vector may include a time offset, a translation, a zoom value, or the like.

Advantageously and preferably, the method further comprises the step of assigning a first set of tab windows and/or a first set of rights regarding tab windows to a first user group, and assigning a second set of tab windows and/or a second set of rights regarding tab windows to a second user group.

This is beneficial as the workflow for measuring and displaying measurement results, which can be created according to the method, can be made available for predefined user groups only. That is, the workflow can be provided to user groups of measurement devices where the workflow is processed during a measurement task.

Advantageously and preferably, the first set of rights regarding tab windows and/or the second set of rights regarding tab windows comprises a maximum number of tab windows, a maximum number of vectors, or a right to create a new tab window.

This is beneficial, as individual rights for changing the workflow can be granted to different user groups, thereby making the method more flexible.

An inventive measurement device for displaying measurement results is configured to: display a first measurement result in a first tab window; create a second tab window; change at least one measurement device setting to display a second measurement result in the second tab window; and store the second tab window.

Advantageously and preferably, the measurement device is further configured to Advantageously and preferably, the measurement device is further configured to display the first tab window and the second tab window in a stacked manner.

Advantageously and preferably, the measurement device is further configured to display the first tab window at a first monitor and to display the second tab window at a second monitor.

Advantageously and preferably, the measurement device is further configured to obtain the second measurement result based on the first measurement result, and/or to derive the second measurement result from the first measurement result.

Advantageously and preferably, the measurement device is further configured to store a vector describing a dependency between the first measurement result and the second measurement result.

Advantageously and preferably, the measurement device is further configured to assign a first set of tab windows and/or a first set of rights regarding tab windows to a first user group, and to assign a second set of tab windows and/or a second set of rights regarding tab windows to a second user group.

Advantageously and preferably, the first set of rights regarding tab windows and/or the second set of rights regarding tab windows comprises a maximum number of tab windows, a maximum number of vectors, or a right to create a new tab window.

The inventive measurement device comprises the same advantages as the inventive method.

An inventive computer program product comprises instructions, which when the program is executed by a computer, cause the computer to carry out the steps of the above described inventive method or any of its advantageous implementation forms.

The inventive computer program product comprises the same advantages as the inventive device.

An inventive computer-readable storage medium comprises instructions which, when executed by a computer, cause the computer to carry out the steps of the above described inventive method or any of its advantageous implementation forms.

The inventive computer-readable storage medium comprises the same advantages as the inventive device.

An exemplary embodiment of the invention is now further explained with respect to the drawings by way of examples only, in which FIG. 1 shows a schematic view of a method according to an embodiment of the present invention;

FIG. 7 shows another schematic view of an operating scenario of the present invention.

Figure 5:
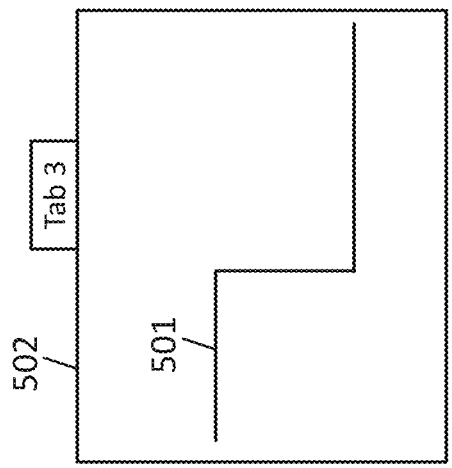
FIG. 5 shows a schematic view of an operating scenario of the present invention.
Figure 5:
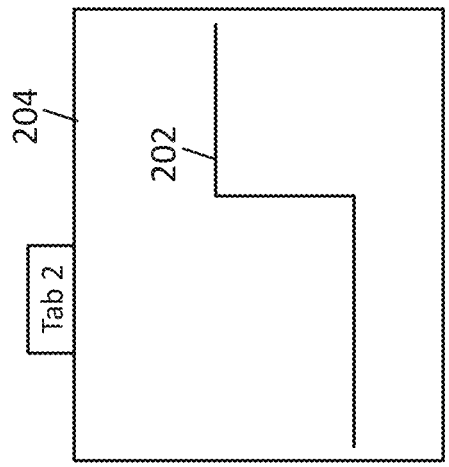
Figure 5:
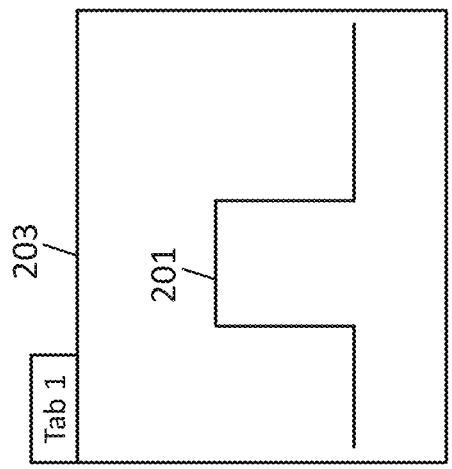
Figure 6:
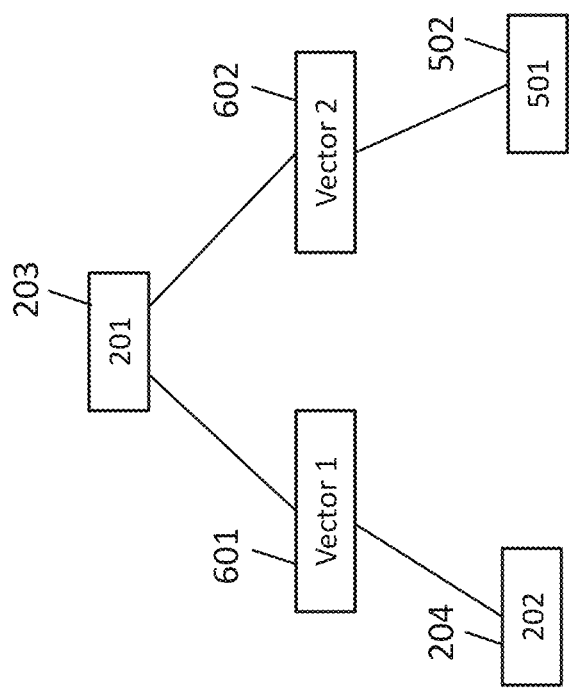
FIG. 6 shows another schematic view of an operating scenario of the present invention.

In the following, the function of an embodiment of the inventive method is described based on FIG. 1. Further, the structure and function of an embodiment of the inventive measurement device is described based on FIG. 2 in general, and based on FIG. 3 and FIG. 4 in more detail. In FIG. 5, FIG. 6 and FIG. 7, operating scenarios according to the present invention are described.

Figure 1:
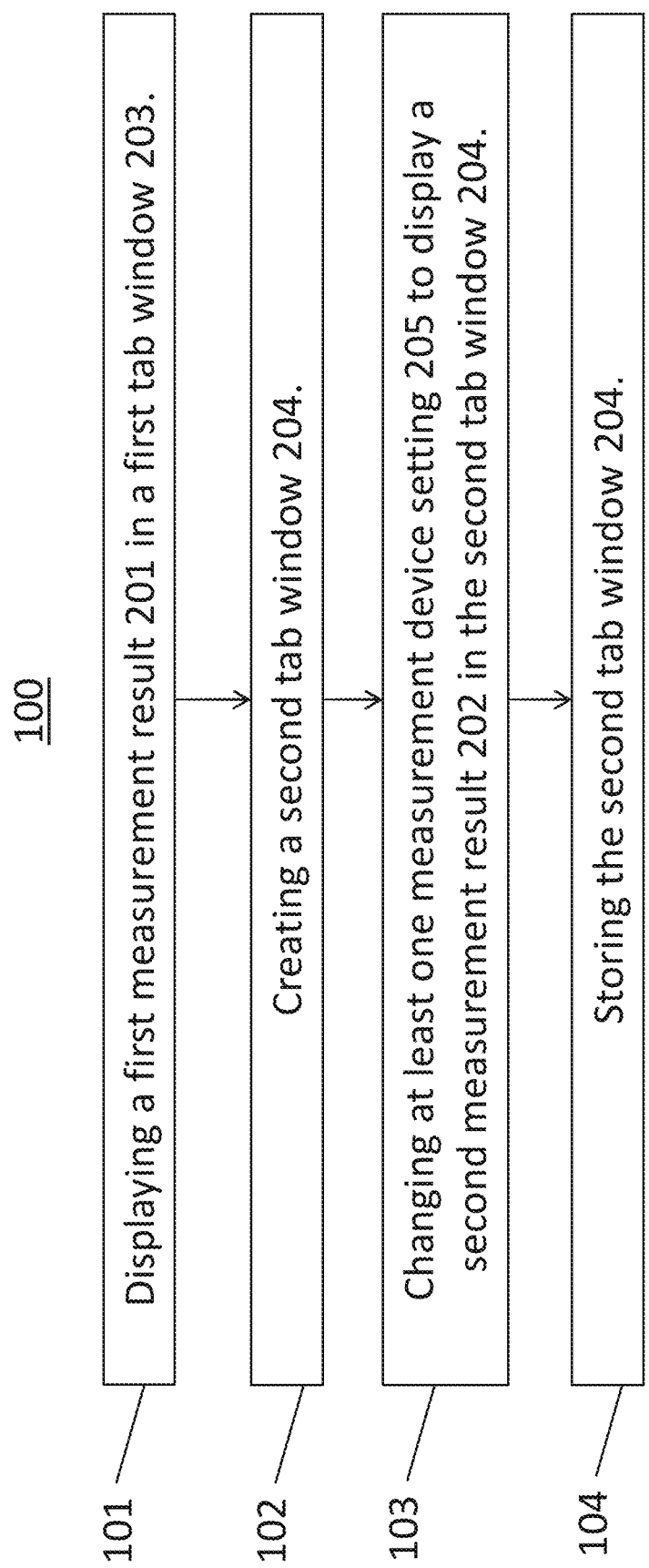

FIG. 1 schematically illustrates a method 100 for displaying measurement results 201, 202. The method 100 comprises a step of displaying 101 a first measurement result 201 in a first tab window 203. The method 100 further comprises a step of creating a second tab window 204. The method comprises another step of changing 103 at least one measurement device setting 205 to display a second measurement result 202 in the second tab window 204. The method comprises another step of storing 104 the second tab window 204.

Figure 2:
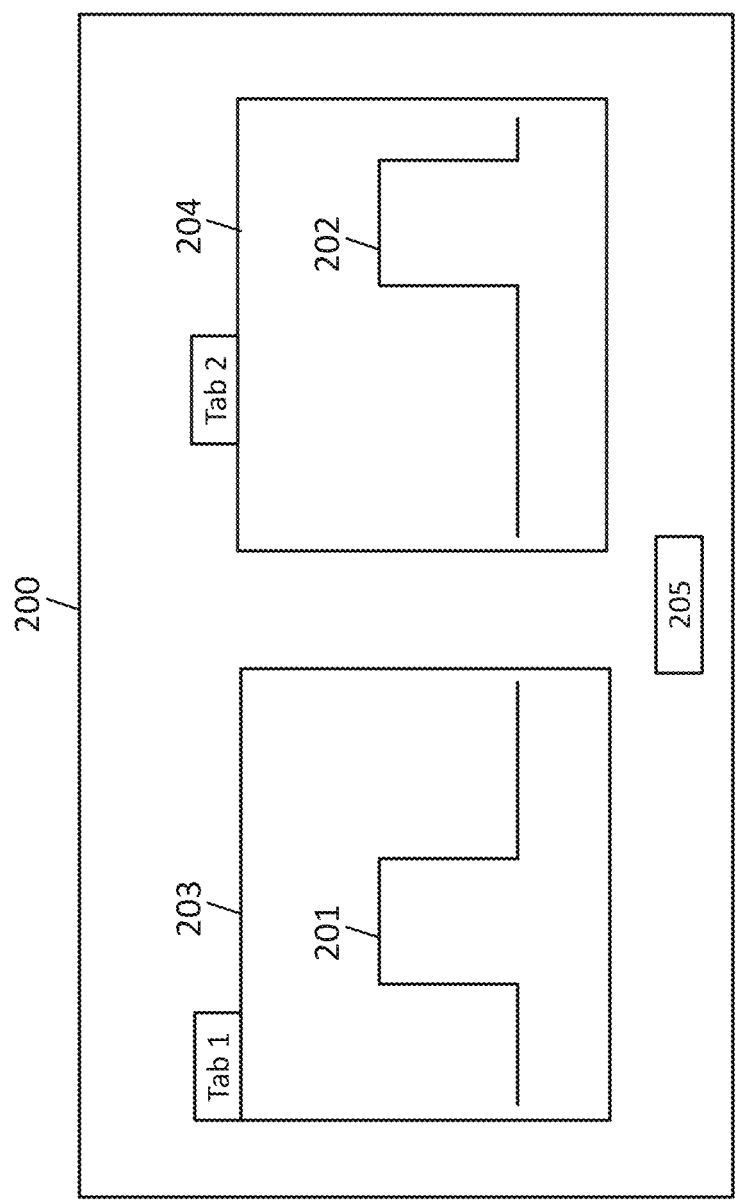
FIG. 2 shows a schematic view of a measurement device according to an embodiment of the present invention.
Figure 3:
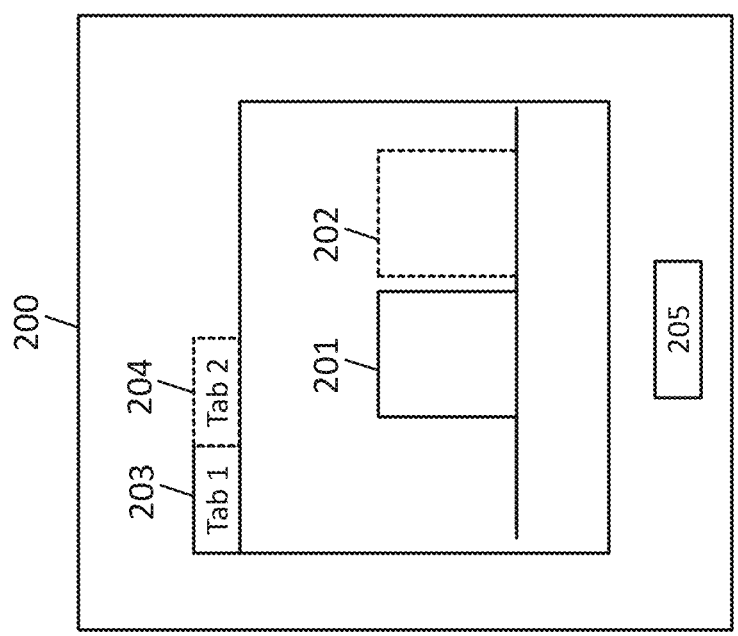
FIG. 3 shows a schematic view of a measurement device according to an embodiment of the present invention in more detail.
Figure 4:
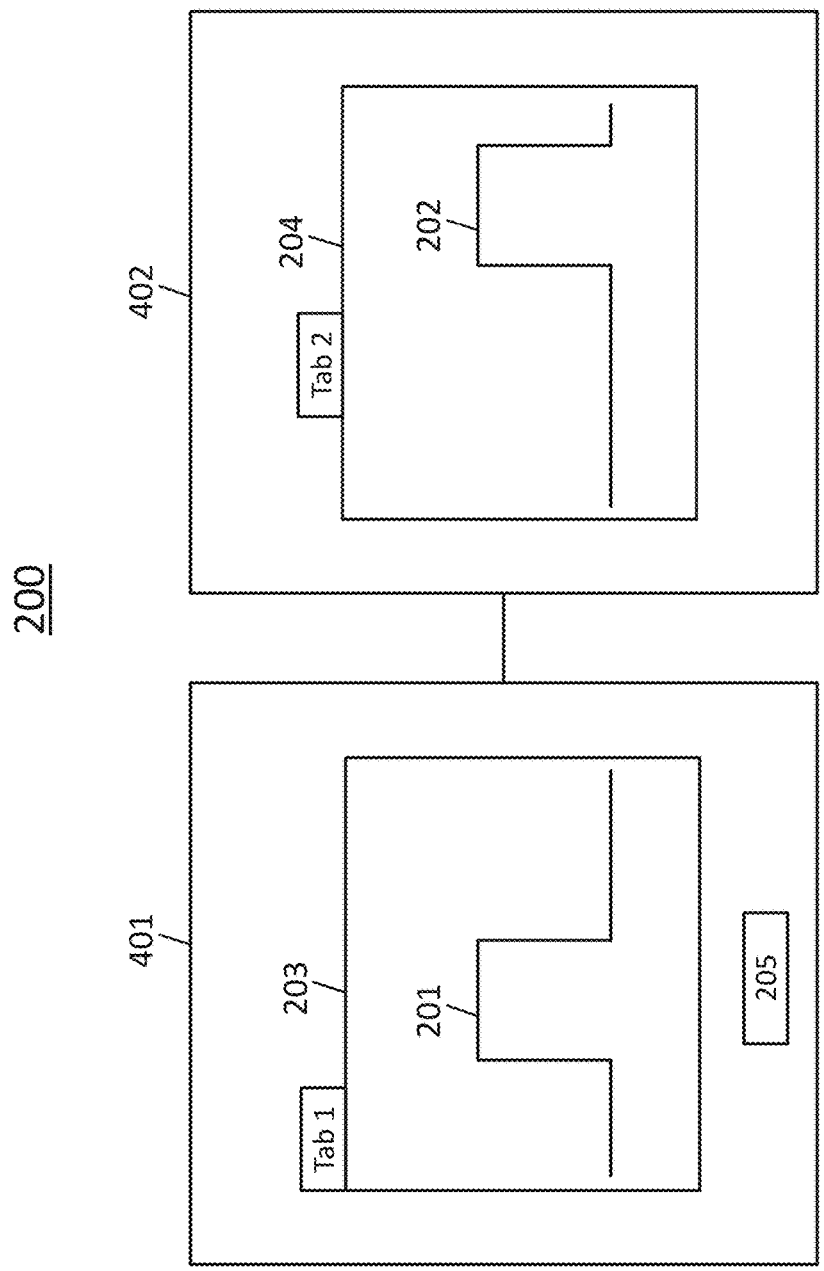
FIG. 4 shows another schematic view of a measurement device according to an embodiment of the present invention in more detail.

In view of FIG. 2, FIG. 3 and FIG. 4, an embodiment of an inventive measurement device 200 is described in general, as well in more detail. The method 100 and the measurement 200 very closely correspond. That is, everything, which is going to be described in view of the measurement device 200 below, also applies to the method 100.

FIG. 2 shows a measurement device 200 for displaying measurement results 201, 202. The measurement device 200 is configured to display a first measurement result 201 in a first tab window 203. The measurement device 200 is further configured to create a second tab window 204 and change at least one measurement device setting 205 to display a second measurement result 202 in the second tab window 204. Finally, the measurement device 200 is also configured to store the second tab window 204.

When performing a measurement task, a user of the measurement device 200 can create several tab windows 203, 204, each of which may correspond to one step of the measurement task.

That is, the first tab window 203 can correspond to probing a first measurement point of an electronic device, and the second tab window 204 can correspond to probing a second measurement point of the electronic device. Depending on the measurement task at hand, the user can create an arbitrary number of tab windows 203, 204 to correctly map the measurement task to the measurement device 200.

FIG. 3 shows an embodiment of the measurement device 200 in more detail. The features, which are going to be described in view of FIG. 3, are optional features of the measurement device 200.

As it is illustrated in FIG. 3, optionally the first tab window 203 and the second tab window 204 can be displayed in a stacked manner. That is, the tab windows are presented in an overlapping manner, wherein one of the windows can be selected, such that only the measurement result of the selected tab window is visible.

In FIG. 3, the first tab window 203 is selected and only the first measurement result 201 is visible. The second tab window 204 is not selected (which is indicated by the rectangle in dashed lines drawn around "tab 2"). That is, the second measurement result 202 (which is also drawn in dashed lines) is not visible, however located below the content of the first tab window 203. As in general, only the labels indicated by "tab 1" and "tab 2" are visible to the user, a clear and well organized way of selecting an presenting several measurement results 201, 202 is provided.

FIG. 4 shows another embodiment of the measurement device 200 in more detail. The features, which are going to be described in view of FIG. 4, are optional features of the measurement device 200.

As it is shown in FIG. 4, the measurement device 200 optionally comprises a first monitor 401 and a second monitor 402. In the illustrated example, the first tab window 203 comprising the first measurement result 201 is shown on the first monitor 401, while the second tab window 204 comprising the second measurement result 202 is shown on the second monitor 402. In a specific embodiment, the first monitor 401 is an integrated monitor of a measurement device 200, while the second monitor 402 is a standalone monitor, which is external, but connected to the measurement device 200. In another specific embodiment, the first monitor 401 is an integrated monitor of a first measurement device, while the second monitor 402 is an integrated monitor of a second measurement device. The first and second measurement devices can be connected to each other to combine their monitors.

According to another specific embodiment, which is not illustrated in FIG. 4, more than one tab window 203 can be shown on the first monitor 401, and more than one tab window 204 can be shown on the second monitor 402. Moreover, the user can flexibly assign tab windows to monitors 401, 402. For example, a first number of tab windows is presented on the first monitor 401, and a second number of tab windows is presented on the second window 402. In another specific embodiment, the second monitor 402 is a monitor larger than the first monitor 401, wherein the second monitor is used for magnified displaying of a measurement result.

FIG. 5 shows an operating scenario according to the present invention in which a second measurement result 202 is obtained based on the first measurement result 201. In other words, the second measurement result 202 is derived from the first measurement result 201. FIG. 5 shows a tab window 203, which displays a first measurement result 201. The first measurement result 201 for example corresponds to a measurement signal, which is obtained in the measurement device 200, e.g. by probing an electronic device. As illustrated in FIG. 5, the second tab window 204 shows a second measurement result 202 which is derived from/obtained based on the first measurement result 201. In particular, the second measurement result 202 only shows the rising clock edge of the first measurement result 201. This allows for magnified presentation of the rising clock edge, e.g. realized by an adapted scale of a time base. In FIG. 5 also a third tab window 502 is shown, which displays a third measurement result 501. The third measurement result 501 is also derived from the first measurement result 201 and illustrates the falling clock edge of the relating measured signal. Again, this allows for magnified presentation of the falling clock edge of the measured signal. This can also be done by adjusting a scale of the time base.

FIG. 6 illustrates another operating scenario of the present invention in which dependencies between measurement results are defined by means of vectors. In particular, FIG. 6 illustrates a vector 601 which describes a dependency between the first measurement result 201 (which is displayed in the first tab window 203) and the second measurement result 202 (which is displayed in the second tab window 204). Further optionally, a dependency between the first measurement result 201 and the third measurement result 501 (which is shown in the third tab window 502) is defined by means of the vector 602. Although this is not shown in FIG. 6, also a dependency between the second measurement result 202 and the third measurement result 501 can be defined by a vector. In particular, the present invention is not limited to the number of three measurement results. Moreover, in an arbitrary quantity of measurement results, the dependency of each two elements of the quantity of results can be described by means of a vector. In particular, the dependency between the measurement results, which is defined by the vector, may be a time offset, a translation, a zoom value, or the like.

FIG. 7 shows another optional operating scenario according to the present invention. In particular, in FIG. 7A, FIG. 7B, FIG. 7C and FIG. 7D, a measurement task for a measurement technician is described, during which several measurement points of an electronic device are probed. The measurement points are e.g. different measurement points for probing power supply values.

FIG. 7A shows a first step of the measurement task, in which a first tab window (labeled with "tab 1") is selected. The first tab window also shows the measurement device settings 205 for measuring the first measurement point.

FIG. 7B shows a second step of a measurement task in which tab window "tab 2" is selected. As can be seen in FIG. 7B the measurement device settings 205 have changed and another measurement result is displayed, which relates to probing another measurement point of the electronic device.

In the measurement step shown in FIG. 7C, tab window "tab 3" is selected, and the measurement device settings 205 have again changed.

In the measurement step illustrated in FIG. 7D, tab window "tab 4" is selected, and the measurement device settings 205 have changed, as well as the signal, which is probed.

By means of the tab windows 203, 204, which are provided by the present invention, every single step of a measurement task can be assigned to a different tab window.

The tab window, which is also associated with measurement device settings, which are specific for the corresponding step of the measurement task, can be saved. The saved tab window can be loaded at a later time, for example, when a similar measurement task is to be performed.

Optionally, the saved tab windows, 203, 204 can be displayed according to their (tree-) structure, which allows for easy adaption of the order in which the tabs are passed through, during a measurement task. Moreover, several tab windows, 203, 204, which relate to a common measurement task, can be stored as a user application. On the one hand side, this allows a user of a measurement device 200 to create his own applications and save them. On the other hand, side, the applications can be provided to other measurement devices 200, where they can be reused during a measurement task.

The fact that a user application, which was once created according to a specific measurement task, can be provided to other measurement devices 200, where the user application can then be replayed, allows effectively adapting any measurement device 200 to a predefined measurement task, which then can be handled in a very efficient manner.

In a specific embodiment, user applications can be created according to a request of a customer. The customer can then be provided with a predefined user application, which precisely fits the needs of the customer. Thereby, measurement tasks of the customer can be efficiently performed by means of measurement devices 200 of the customer, which are supplied with the user application, which is created according to the customer's needs.

It is important to note that the inventive system and method very closely correspond. Therefore, all of the above said regarding the system is also applicable to the method and vice versa. Everything, which is described in the description and/or claimed in the claims and/or drawn in the drawings, can be combined.

The invention is not limited to the illustrated embodiment. All features described above or features shown in the figures can be combined with each other in any advantageous manner within the scope of the invention.

What is claimed is:

1. A method for displaying measurement results, wherein the method comprises the steps of:
    displaying a first measurement result in a first tab window;
    creating a second tab window;
    changing at least one measurement device setting to display a second measurement result in the second tab window;
    storing the second tab window; and
    storing a vector describing a dependency between the first measurement result and the second measurement result, wherein the vector further describes a dependency between the first tab window and the second tab window.

2. The method according to claim 1, further comprising the step of displaying the first tab window and the second tab window in a stacked manner.

3. The method according to claim 1, further comprising the step of displaying the first tab window at a first monitor and displaying the second tab window at a second monitor.

4. The method according to claim 1, further comprising the step of obtaining the second measurement result based on the first measurement result, and/or deriving the second measurement result from the first measurement result.

5. The method according to claim 1, further comprising the step of assigning a first set of tab windows and/or a first set of rights regarding tab windows to a first user group, and assigning a second set of tab windows and/or a second set of rights regarding tab windows to a second user group.

6. The method according to claim 5, wherein the first set of rights regarding tab windows and/or the second set of rights regarding tab windows comprises a maximum number of tab windows, a maximum number of vectors, or a right to create a new tab window.

7. A measurement device for displaying measurement results, wherein the measurement device is configured to:
    display a first measurement result in a first tab window;
    create a second tab window;
    change at least one measurement device setting to display a second measurement result in the second tab window;
    store the second tab window; and
    store a vector describing a dependency between the first measurement result and the second measurement result, wherein the vector further describes a dependency between the first tab window and the second tab window.

8. The measurement device according to claim 7, further configured to display the first tab window and the second tab window in a stacked manner.

9. The measurement device according to claim 7, further configured to display the first tab window at a first monitor and to display the second tab window at a second monitor.

10. The measurement device according to claim 7, further configured to obtain the second measurement result based on the first measurement result, and/or to derive the second measurement result from the first measurement result.

11. The measurement device according to claim 7, further configured to assign a first set of tab windows and/or a first set of rights regarding tab windows to a first user group, and to assign a second set of tab windows and/or a second set of rights regarding tab windows to a second user group.

12. The measurement device according to claim 11, wherein the first set of rights regarding tab windows and/or the second set of rights regarding tab windows comprises a maximum number of tab windows, a maximum number of vectors, or a right to create a new tab window.

13. A non-transitory computer-readable storage medium carrying one or more sequences of one or more instructions which, when executed by one or more processors, cause an apparatus to perform the steps of:
    displaying a first measurement result in a first tab window;
    creating a second tab window;
    changing at least one measurement device setting to display a second measurement result in the second tab window;
    storing the second tab window; and
    storing a vector describing a dependency between the first measurement result and the second measurement result, wherein the vector further describes a dependency between the first tab window and the second tab window.

* * * * *